(12) United States Patent
Chadha

(10) Patent No.: US 12,512,358 B2
(45) Date of Patent: Dec. 30, 2025

(54) ELECTROSTATICALLY SECURED SUBSTRATE SUPPORT ASSEMBLY

(71) Applicant: Applied Materials, Inc., Santa Clara, CA (US)

(72) Inventor: Arvinder Manmohan Singh Chadha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 168 days.

(21) Appl. No.: 18/377,752

(22) Filed: Oct. 6, 2023

(65) Prior Publication Data
US 2025/0118586 A1    Apr. 10, 2025

(51) Int. Cl.
| | |
|---|---|
| *H01L 21/683* | (2006.01) |
| *H01L 21/67* | (2006.01) |
| *H01L 21/687* | (2006.01) |
| *B23Q 3/15* | (2006.01) |

(52) U.S. Cl.
CPC .... *H01L 21/6833* (2013.01); *H01L 21/67109* (2013.01); *H01L 21/68742* (2013.01); *H01L 21/68757* (2013.01); *H01L 21/68785* (2013.01); *B23Q 3/15* (2013.01)

(58) Field of Classification Search
CPC . B23Q 3/15; H01L 21/67109; H01L 21/6831; H01L 21/6833; H01L 21/68742; H01L 21/68757; H01L 21/68785
USPC ......................................................... 361/234
See application file for complete search history.

(56) References Cited

U.S. PATENT DOCUMENTS

| | | |
|---|---|---|
| 6,081,414 A | 6/2000 | Flanigan et al. |
| 6,853,533 B2 | 2/2005 | Parkhe |
| 7,479,456 B2 | 1/2009 | Buchberger, Jr. et al. |
| 7,480,129 B2 * | 1/2009 | Brown ................ H01L 21/6831 451/296 |
| 7,589,950 B2 | 9/2009 | Parkhe et al. |
| 8,226,769 B2 | 7/2012 | Matyushkin et al. |
| 8,390,980 B2 | 3/2013 | Sansoni et al. |
| 8,633,423 B2 | 1/2014 | Lin et al. |
| 9,117,867 B2 | 8/2015 | Hwang et al. |
| 9,520,315 B2 | 12/2016 | Parkhe et al. |
| 9,622,375 B2 | 4/2017 | Busche et al. |
| 9,728,437 B2 | 8/2017 | Tran et al. |
| 9,984,911 B2 | 5/2018 | Hanson et al. |
| 10,008,399 B2 | 6/2018 | Parkhe |

(Continued)

FOREIGN PATENT DOCUMENTS

KR    20140130356 A    11/2014

OTHER PUBLICATIONS

International Search Report and Written Opinion for International Application No. PCT/US2024/011859, mailed Jun. 28, 2024, 11 Pages.

*Primary Examiner* — Kevin J Comber
(74) *Attorney, Agent, or Firm* — Lowenstein Sandler LLP

(57) ABSTRACT

A substrate support assembly includes a cooling plate and a chuck disposed on the cooling plate. The chuck includes one or more heating electrodes, and one or more clamp electrodes to electrostatically secure the chuck to the cooling plate. Another substrate support assembly includes a cooling plate, a first puck plate bonded to the cooling plate, and a second puck plate disposed on the first puck plate. The second puck plate includes one or more clamp electrodes to electrostatically secure the second puck plate to the first puck plate.

20 Claims, 8 Drawing Sheets

(56) References Cited

U.S. PATENT DOCUMENTS

| | | |
|---|---|---|
| 10,008,404 B2 | 6/2018 | Parkhe |
| 10,079,165 B2 | 9/2018 | Parkhe et al. |
| 10,186,444 B2 | 1/2019 | Kim et al. |
| 10,957,572 B2 | 3/2021 | Parkhe |
| 2012/0037068 A1 | 2/2012 | Su et al. |
| 2013/0088809 A1 | 4/2013 | Parkhe et al. |
| 2014/0268479 A1 | 9/2014 | West et al. |
| 2014/0319121 A1* | 10/2014 | Kim .................. H01L 21/67109 |
| | | 219/444.1 |
| 2015/0036259 A1* | 2/2015 | Cox .................... H01L 21/6833 |
| | | 361/234 |
| 2016/0225652 A1 | 8/2016 | Tran et al. |
| 2017/0047867 A1 | 2/2017 | Wang et al. |
| 2017/0345698 A1 | 11/2017 | Hammond, IV et al. |
| 2017/0352566 A1 | 12/2017 | Ramaswamy et al. |
| 2018/0025931 A1 | 1/2018 | Nemani et al. |
| 2018/0151402 A1* | 5/2018 | Noorbakhsh ....... H01L 21/6831 |
| 2019/0341289 A1* | 11/2019 | Parkhe .............. H01L 21/68785 |
| 2020/0090973 A1 | 3/2020 | Launay |
| 2020/0411354 A1 | 12/2020 | Rao et al. |

\* cited by examiner

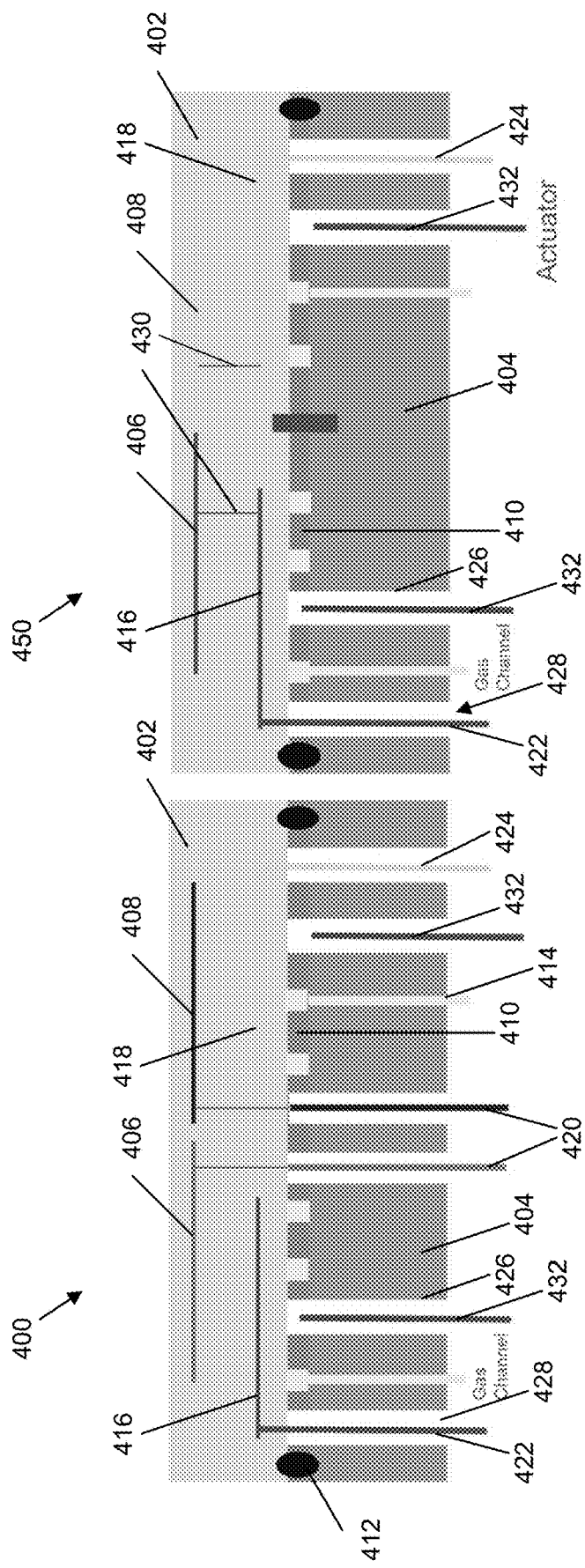

ELECTROSTATICALLY SECURED SUBSTRATE SUPPORT ASSEMBLY

TECHNICAL FIELD

Some embodiments of the present disclosure relate, in general, to a substrate support assembly having one or more puck plates and a cooling plate, which are attached together using one or more clamp electrodes.

BACKGROUND

Chucks are widely used to hold and secure substrates, such as semiconductor wafers, during various substrate processes like etching, deposition, and lithography. The specific type of chuck used depends on the specific requirements of the semiconductor manufacturing process, including factors such as wafer size, material, temperature sensitivity, and process compatibility. Some commonly used chucks include vacuum chucks, electrostatic chucks, mechanical chucks, magnetic chucks, piezoelectric chucks, wafer carrier chucks, edge grip chucks, heated chucks, and coolant chucks.

Electrostatic chucks (ESCs) typically include one or more electrodes embedded within a unitary chuck body, which includes a dielectric or semi-conductive ceramic material across which an electrostatic clamping field can be generated to chuck a substrate. Heating elements may be included in the electrostatic chucks to heat a supported substrate.

ESCs are traditionally formed from a single, monolithic, ceramic body that includes all of the functional elements of the electrostatic chuck. An organic bonding material is traditionally used to bond the ceramic body to a metal cooling plate, which limits power dissipation for high temperature processes such as etching. High temperatures or cryogenic temperatures may be used for high plasma power for etching or high surface temperatures may be needed to etch hard masks. High temperature etching may involve etching dielectric films including oxides, nitrides, or hafnium oxides; semi-conducting films including poly-Si, p-doped Si, n-doped Si, or Si; metal films including W, Cu, Al, Mo, or Ni; or combinations thereof. However, due to the use of an organic bonding material, current electrostatic chucks may not be suitable for high temperature applications.

Some conventional electrostatic chucks use metal cooling plates that may be coated with a dielectric using spray coating, anodization, or a combination thereof. However, the quality of the coating may degrade due to stress, fatigue, and/or creep that may result from thermal cycling and may eventually lead to arcing. Stresses within the electrostatic chuck may arise due to difference in the coefficients of thermal expansion of the materials used in forming the electrostatic chuck. Plasma may also wear off the bond material bonding two or more components of the electrostatic chuck, which may result in degrading performance across the wafer. As a result, the plates forming the chuck may need to be replaced from time to time. However, replacement of a plate can be a time consuming and laborious process. For example, the plates have to be first separated from the cooling plate, which may involve prying open the plates. Then the bonding layer that bonds the plates to the cooling plate has to be removed from the cooling plate's surface using a solution that dissolves the bonding material, or by laser removal, or by thermal decomposition of the bond material, before a replacement plate can be installed. In some instances, the plates may crack during the separation process and may become unrecoverable. Consequently, replacement of the plates may impact efficiency of the semiconductor manufacturing process.

SUMMARY

Some embodiments of the present disclosure described herein cover a substrate support assembly including a cooling plate and a chuck disposed on the cooling plate. The chuck includes one or more heating electrodes, and one or more clamp electrodes to electrostatically secure the chuck to the cooling plate.

Some embodiments of the present disclosure described herein cover a substrate support assembly including a cooling plate, a first puck plate bonded to the cooling plate, and a second puck plate disposed on the first puck plate. The second puck plate includes one or more clamp electrodes to electrostatically secure the second puck plate to the first puck plate.

Some embodiments of the present disclosure described herein cover a method of forming a substrate support assembly. The method may include disposing one or more puck plates onto a cooling plate, and electrostatically securing the one or more puck plates to the cooling plate.

Some embodiments of the present disclosure described herein cover a method for replacing a plate in a substrate support assembly. The method includes disconnecting a power source powering a clamp electrode in a puck plate or a cooling plate of the substrate support assembly. The method further includes extending lift pins in the cooling plate to lift the puck plate above the cooling plate, and removing the puck plate from the lift pins using a robotic arm. The method further includes placing a replacement puck plate onto the lift pins, and lowering the lift pins to position the replacement puck plate on the cooling plate, and electrostatically securing the replacement puck plate to the cooling plate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 4A & 4B depict sectional side views of embodiments of a substrate support assembly;

DETAILED DESCRIPTION OF EMBODIMENTS

Figure 1:
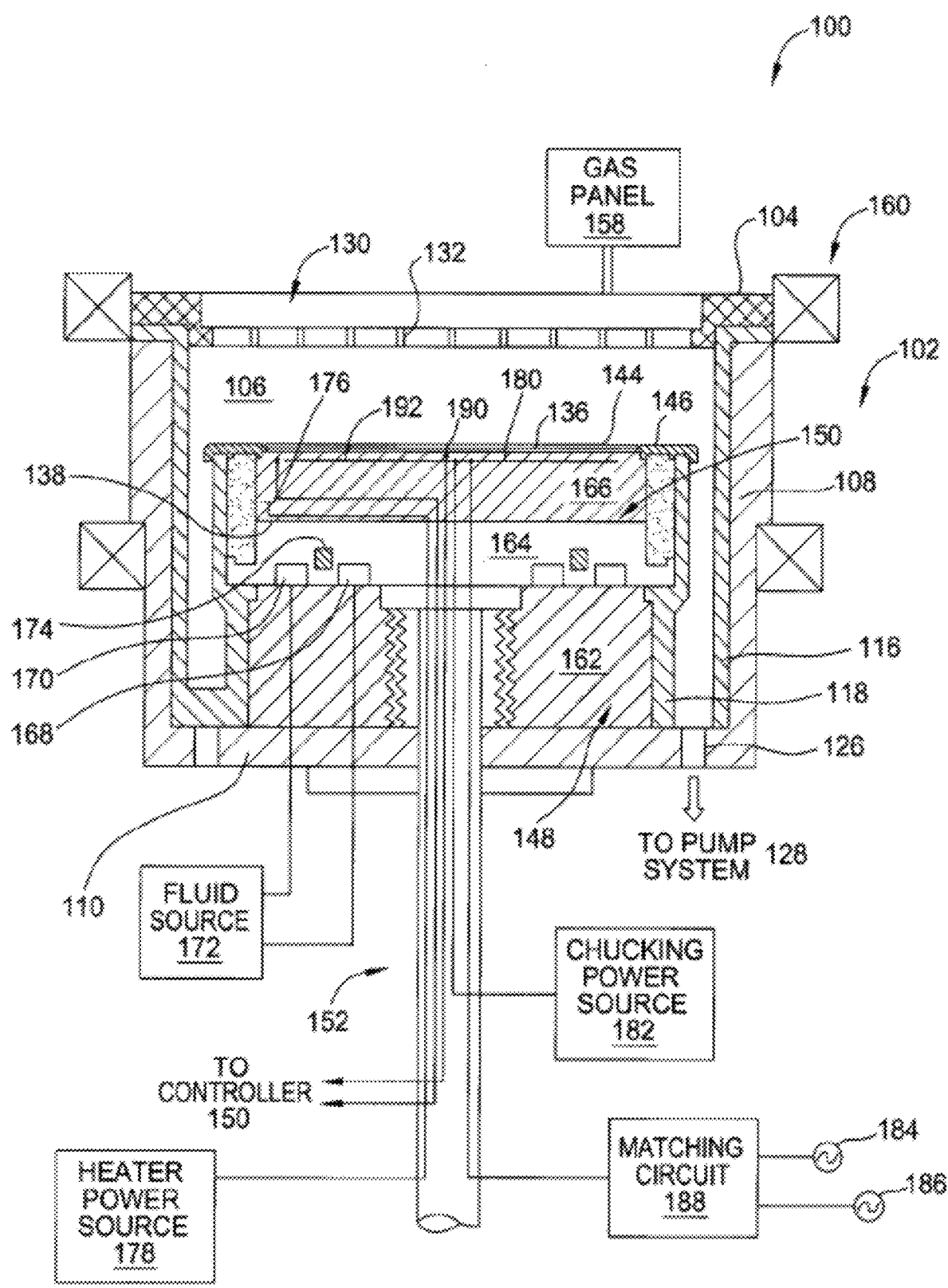
FIG. 1 depicts a sectional side view of one embodiment of a processing chamber.

Embodiments of the present disclosure provide a substrate support assembly including a chuck having one or more components that are electrostatically secured to a cooling plate and/or other plate of the substrate support assembly. The chuck may be a vacuum chuck, an electrostatic chuck, a mechanical chuck, a magnetic chuck, a piezoelectric chuck, a wafer carrier chuck, an edge grip chuck, a heated chuck, or a coolant chuck. The chuck may have one or more clamp electrodes to electrostatically secure the chuck to the cooling plate. The clamp electrodes may be disposed closer to a bottom surface of the chuck so that the chuck is tightly secured to the cooling plate. Alternatively, or in addition, the clamp electrodes may be disposed closer to a top surface of the chuck and a greater potential may be applied so that the chuck is tightly secured to the cooling plate. In an alternative implementation, the chuck may include multiple plates, and one or more upper plates of the chuck may be electrostatically secured to one or more lower plates of the chuck.

The chuck may include additional clamp electrodes disposed closer to a top surface to secure a substrate or a wafer thereon. The substrate support assembly is able to support high temperature (e.g., greater than 150° C.) applications as well as low temperature (e.g., lesser than −150° C.) applications in embodiments. In some embodiments, the substrate support assembly may include a ceramic cooling plate (also referred to as a dielectric cooling plate), which enhances power dissipation for high temperature processes such as etching. Alternatively, the cooling plate may be a metal cooling plate. Embodiments are also directed to a dielectric cooling plate usable in a substrate support assembly. The dielectric cooling plate may include one or more clamp electrodes that secure the chuck onto the cooling plate. The clamp electrodes may be disposed in one or more plates of the dielectric cooling plate. The substrate support assembly may be used in processes where high plasma power may be used (e.g., dielectric film etching) or where high surface temperatures may be used to etch hard masks, for example. Additionally, in some embodiments since both the chuck and the cooling plate are made of a dielectric material (e.g., which may have the same or nearly the same coefficient of thermal expansion (CTE) and thermal conductivity), the disclosed substrate support assemblies do not degrade, or minimally degrade, due to stress, fatigue, and/or creep that may result from thermal cycling.

In one embodiment, the chuck may include one or more puck plates including one or more functional elements. The functional elements may include a clamp electrode, a heating element, a zone heater, a pixelated heater, a radio frequency (RF) electrode, a RF filter, a gas channel, a cooling channel, or combinations thereof. In one embodiment, a puck plate may include one or more clamp electrodes, one or more peripheral RF electrodes, one or more heating elements, such as for a zone heater and/or a pixelated heater, and one or more RF electrodes. In some embodiments, the puck plate may include a RF filter to ensure that interference and noise are minimized, reducing any potential impact on the substrate. The substrate support assembly may further include a dielectric cooling plate including one or more cooling loops or channels to circulate a cooling fluid (e.g., a coolant or a refrigerant or gas) and absorb the heat from the puck plate. The dielectric cooling plate may also include one or more gas channels for a gas (e.g., inert gas) to flow therethrough. The dielectric cooling plate may additionally include one or more through holes to accommodate lift pins that may be engaged to lift the ceramic puck plate away from the cooling plate. Similarly, the lift pins may be lowered into the through holes of the cooling plate when disengaged. The cooling plate may also include one or more vias through which one or more terminals connecting the functional elements within the chuck may be connected to a power source. The ceramic puck plate and the cooling plate may be separated by an interface layer. The interface layer may include Ni, Ti, C, Si, a flexible graphite layer, an organic elastomer, Al, In, Ni, Ti, and/or an alloy including Ni—Ti or Mo—Mg, or Cu—Ag or Al alloy. The interface layer may have a CTE and/or thermal conductivity that is similar or equal to the puck plate and/or cooling plate. In some embodiments, the interface layer may have a CTE and/or thermal conductivity that may be different from the puck plate and/or cooling plate. The interface layer may have vias, through holes, and gas channels that correspond to the vias, through holes, and gas channels formed in the cooling plate, respectively, such that a gas (e.g., He) may be pumped to facilitate separation of the puck plate from the cooling plate.

Examples of materials that may be used in forming one or more puck plates and the cooling plate include niobium, aluminum oxide, aluminum nitride, single crystal alumina, or sapphire. In some embodiments, the puck plate and the dielectric cooling plate are bonded using a metal bond. The substrate support assembly including the puck plate and the cooling plate may be formed using a hot press, a hot isostatic press, a green sheet, a gel cast, or a sol gel process, for example. In some embodiments, the puck plate is an electrostatic chuck.

Embodiments of the present disclosure also provide a substrate support assembly including a cooling plate, a first puck plate bonded to the cooling plate, and a second puck plate disposed on the first puck plate. The second puck plate includes one or more clamp electrodes to electrostatically secure the second puck plate to the first puck plate. Additionally, or alternatively, the first puck plate may include one or more clamp electrodes. In some embodiments, the first puck plate may not include any clamp electrodes.

Embodiments of the present disclosure also provide a substrate support assembly including a dielectric cooling plate having a first dielectric plate and a second dielectric plate. The first dielectric plate may include one or more through holes for the lift pins to be installed therein. The first dielectric plate may further include one or more vias for one or more terminals connecting one or more functional elements in puck plate to pass therethrough. The first dielectric plate may include one or more gas channels for a gas (e.g., He) to pass therethrough. The first dielectric plate may be in direct contact with the puck plate, either with or without an interface layer. The second dielectric cooling plate may include one or more through holes, one or more vias, and one or more gas channels corresponding to the through holes, vias, and gas channels formed in the first dielectric plate. The puck plate and the component plates of the dielectric cooling plate may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck plate and/or the cooling plate include niobium, aluminum oxide, aluminum nitride, single crystal alumina, or sapphire.

Embodiments of the present disclosure also provide a method of forming a substrate support assembly. The method may include disposing one or more puck plates onto a cooling plate, and electrostatically securing the one or more puck plates to the cooling plate. The puck plates may include one or more clamp electrodes that secure the puck plate to the cooling plate. In some embodiments, the puck plates may include additional clamp electrodes to secure a substrate or wafer onto the puck plate. In some embodiments, the puck plates may not include additional clamp electrodes and a greater potential may be used to secure the wafer to the puck plate and the puck plate to the cooling plate.

Embodiments of the present disclosure also provide a method for replacing one or more plates in a substrate support assembly. The method may include disconnecting (e.g., powering off) a power source powering a clamp electrode in a puck plate or a cooling plate such that the puck plate is not secured to the cooling plate anymore. The method may further include extending lift pins in the cooling plate to lift the puck plate away from the cooling plate and removing the puck plate from the lift pins using an arm (e.g., robotic arm). The method may further include repairing the puck plate and placing the repaired puck plate or a replacement puck plate onto the lift pins. The method may further include lowering the lift pins to position the replacement puck plate on the cooling plate, and electrostatically securing the repaired puck plate or the replacement puck plate to the cooling plate. In some embodiments, the repaired puck plate or the replacement puck plate can be secured to the cooling plate by connecting or powering back the clamp electrodes in the puck plate and/or cooling plate.

FIG. 1 is a sectional view of one embodiment of a processing chamber 100 having a substrate support assembly 150 disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, a mechanical chuck assembly, a magnetic chuck assembly, a piezoelectric chuck assembly, a wafer carrier chuck assembly, an edge grip chuck assembly, a heated chuck assembly, a coolant chuck assembly, and so on. In one embodiment, the substrate support assembly 150 includes a puck assembly (also referred to as a chuck) 166 including one or more puck plates. The substrate support assembly 150 may additionally include two or more plates, where each plate may include zero or more different functional elements of the substrate support assembly (e.g., clamp electrodes, radiofrequency (RF) electrodes, main heating electrodes, auxiliary heating electrodes, cooling channels, and so on). The substrate support assembly 150 may further include a cooling plate 164, which may be formed from a metal or a dielectric material (e.g., ceramic). The puck assembly 166 and the cooling plate 164 may be separated by an interface layer including a metal, an organic material, a polymer, or combinations thereof.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 is part of a greater assembly 148 that includes the substrate support assembly 150 as well as a mounting plate 162 supporting a pedestal 152. In one embodiment, the substrate support assembly 150 further includes a thermally conductive base referred to herein as a cooling plate 164 coupled to a puck assembly (also referred to as a puck plate assembly) 166. In one embodiment, the cooling plate 164 is electrostatically coupled to the puck assembly 166 by energizing one or more clamping electrodes. The cooling plate 164 may alternatively be coupled to the puck assembly 166 using a dielectric material and/or by a bonding layer. The substrate support assembly 150 described in embodiments may be used for Johnsen-Rahbek and/or Coulombic electrostatic chucking of substrates in embodiments. In some embodiments, the puck plate assembly (e.g., chuck) 166 is electrostatically secured to the cooling plate using Johnsen-Rahbek and/or Coulombic electrostatic chucking. The substrate support assembly 150 may additionally or alternatively be used as a heater, such as a deposition heater that is configured to heat a support substrate 144 during a deposition process.

In one embodiment, a protective ring 146 is disposed over a portion of the puck assembly 166 at an outer perimeter of the puck assembly 166. In one embodiment, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In some embodiments, the puck assembly 166 is a single monolithic ceramic puck plate. In some embodiments, the puck assembly 166 may include an upper puck plate (not shown) and a lower puck plate (not shown) bonded by a metal and/or organic bond. In some embodiments, the puck assembly 166 may include two or more plates that may be secured to each other using clamp electrodes that may be disposed in one or more plates. The puck assembly 166 and/or the cooling plate 164 may be formed from a monolithic dielectric or electrically insulative material (e.g., having an electrical resistivity of greater than $10^{14}$ Ohm·meter) that is usable for semiconductor processes at temperatures of 150° C. and above. In one embodiment, the puck assembly 166 and/or the cooling plate 164 is composed of materials usable from about 20° C. to about 500° C. In one embodiment, the puck assembly 166 and/or the cooling plate 164 is AlN, $Al_2O_3$, or another ceramic. The puck assembly 166 and/or the cooling plate 164 may be undoped or may be doped. For example, the AlN or $Al_2O_3$ may be doped with Samarium oxide ($Sm_2O_3$), Cerium oxide ($CeO_2$), Titanium dioxide ($TiO_2$), or a transition metal oxide. In one embodiment, the puck assembly 166 and/or the cooling plate 164 include $Al_2O_3$. The $Al_2O_3$ puck assembly 166 and/or the cooling plate 164 may be undoped or may be doped. For example, the $Al_2O_3$ may be doped with Titanium dioxide ($TiO_2$) or a transition metal oxide. In some embodiments, each of the puck assembly 166 and/or the cooling plate 164 may be formed of a same ceramic. In other embodiments, puck assembly 166 and/or the cooling plate 164 may formed of the same ceramic material, different ceramic materials, the same ceramic material with different purities, the same ceramic material with different grain sizes, different ceramic materials with different grain sizes, or different ceramic materials with different purities.

The puck assembly 166 may have a coefficient of thermal expansion (CTE) and/or thermal conductivity that is matched or close to that of the cooling plate 164. In one embodiment, the puck assembly 166 and/or the cooling plate 164 is a SiC porous body that is infiltrated with an AlSi alloy (referred to as AlSiSiC). The puck assembly 166 and/or the cooling plate 164 may alternatively be AlN or $Al_2O_3$ or other ceramic material or a combination thereof (e.g., aluminum oxynitride (ALON)). In one embodiment, the puck assembly 166 and/or the cooling plate 164 include undoped AlN or undoped $Al_2O_3$. In one embodiment, the puck assembly 166 is composed of the same material as the cooling plate 164. The AlSiSiC material, AlN or $Al_2O_3$ may be used, for example, in reactive etch environments or in inert environments.

In one embodiment, the puck assembly 166 and/or the cooling plate 164 is Molybdenum. Molybdenum may be used, for example, if the puck assembly 166 is to be used in an inert environment. Examples of inert environments include environments in which inert gases such as Ar, O2, N, etc. are flowed. Molybdenum may be used, for example, if the puck assembly 166 is to chuck a substrate for metal deposition. Molybdenum may also be used for the cooling plate 164 for applications in a corrosive environment (e.g., etch applications). In such an embodiment, exposed surfaces of the puck assembly 166 and/or the cooling plate 164 may be coated with a plasma resistant coating. The plasma coating may be performed via a plasma spray process. The plasma resistant coating may cover, for example, side walls of the cooling plate and an exposed horizontal step of the cooling plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In embodiments, different functions of the puck assembly 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck assembly 166 may include RF electrodes, clamp electrodes, and/or heating electrodes. In one embodiment, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166, consequently heating and/or cooling the puck assembly 166 and a substrate (e.g., a wafer) being processed. In one embodiment, the puck assembly 166 includes two separate heating zones that can maintain distinct temperatures. In another embodiment, the puck assembly 166 includes four or more different heating zones that can maintain distinct temperatures. The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144.

In one embodiment, the puck assembly 166 include one or more clamping electrodes 180 controlled by a chucking power source 182. The clamping electrodes 180 may be used to clamp the puck assembly 166 to the cooling plate 164 and/or the wafer to the puck assembly 166. In one embodiment, puck assembly 166 includes at least two clamping electrodes 180, where a first clamping electrode is used to electrostatically clamp a substrate to the puck assembly 166 and a second clamping electrode is used to electrostatically clamp the puck assembly 166 to cooling plate 164. In one embodiment, the first and second clamping electrodes are connected to different power sources. In one embodiment, the first and second clamping electrodes are connected to a same power source.

The clamping electrodes 180 may be included in one or more plates of puck assembly 166. The clamping electrodes 180 (also referred to as clamp electrodes) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
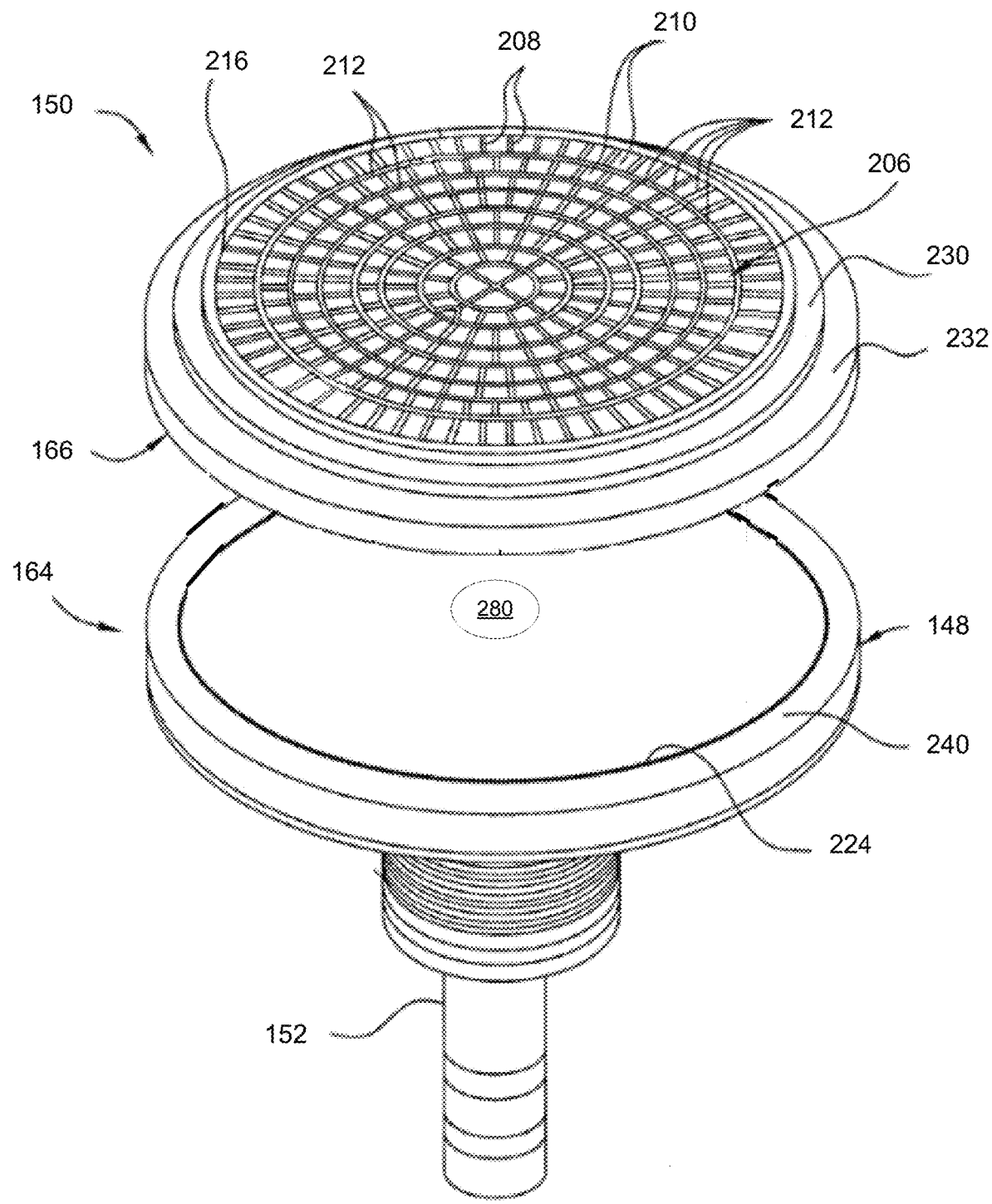
FIG. 2 depicts an exploded view of one embodiment of a substrate support assembly.

FIG. 2 depicts an exploded view of one embodiment of the substrate support assembly 150. The substrate support assembly 150 includes the puck assembly 166 and the cooling plate 164 including the pedestal 152. In some embodiments, the cooling plate 164 may be attached to the puck assembly 166 using one or more clamp electrodes (e.g., clamp electrodes 180). The interior volumes within the substrate support assembly 150 may include open spaces 280 within the pedestal 152 for routing conduits and wiring.

In some embodiments, in addition to, or instead of, clamping using the clamp electrodes 180, the puck assembly 166 and the dielectric cooling plate 164 can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy. Examples of materials that may be used in forming the puck assembly 166 and the dielectric cooling plate 164 include niobium, aluminum oxide, aluminum nitride, single crystal alumina, or sapphire. The puck assembly 166 and the dielectric cooling plate 164 may be individually formed using a hot press, a hot isostatic press, a green sheet, a gel cast, or a sol gel process, for example.

The puck assembly 166 may include one or more embedded functional elements, which may include a clamp electrode, a heating element, a zone heater, a pixelated heater, a radio frequency (RF) electrode, a RF filter, a gas channel, a cooling channel, or combinations thereof. In one embodiment, the puck assembly 166 may include two or more pairs of clamp electrodes. One pair of clamp electrodes may be energized to secure the puck assembly 166 to the cooling plate 164, and another pair of clamp electrodes may be energized to secure a substrate or wafer to the puck assembly 166. The cooling plate 164 may include one or more cooling loops or channels to circulate a cooling fluid (e.g., a coolant or a refrigerant or gas). The cooling plate 164 may further include one or more channels for a gas (e.g., inert gas) to flow therethrough. The puck assembly 166 and the dielectric cooling plate 164 may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck assembly 166 and the cooling plate 164 include niobium, aluminum oxide, aluminum nitride, single crystal alumina, or sapphire.

In one embodiment, the puck assembly 166 has a disc-like shape having an annular periphery that may substantially match the shape and size of the substrate 144 positioned thereon. An upper surface of the puck assembly 166 may have an outer ring 216, multiple mesas 206, 210 and channels 208, 212 between the mesas 210. In one embodiment, the puck assembly 166 includes an upper puck plate 230 bonded to the lower puck plate 232 by a metal bond, a ceramic bond, an organic bond, a polymer bond, or other type of bond. In one embodiment, the lower puck plate 232 may be bonded to the cooling plate 164 and the upper puck plate 230 may include one or more clamp electrodes that may be used to attach (e.g., electrostatically secure) the upper puck plate 230 to the lower puck plate 232. In one embodiment, a bond or interface layer between the two puck plates has different thermal conductivity in different directions. For example, the bond or interface layer may have different thermal conductivity in the x, y and/or z directions. In some embodiments, the bond or interface layer comprises a ceramic with metal fillers (e.g., having ellipsoid particles). The metal fillers may alter a thermal conductivity of the bond in a targeted direction. The thermal conductivity of the bond or interface layer may accordingly be tailored in one or more directions or planes so that it has isotropic or anisotropic heat transfer properties. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material or cooling plate 164 in order to minimize CTE mismatch and avoid thermomechanical stresses which may damage the puck assembly 166 during thermal cycling. In one embodiment, the lower puck plate 232 is Molybdenum. In one embodiment, the lower puck plate is alumina. In one embodiment, the lower puck plate is AlN or $Al_2O_3$. The lower puck plate may be composed of a same material as the upper puck plate or cooling plate 164, but may have a different purity level, a different grain size, different amounts of dopants, and so on to provide different material properties for the lower puck plate than the upper puck plate in embodiments.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The cooling plate 164 attached below the puck assembly 166 may have a disc-like main portion 224, which may accommodate an interface layer as described in the later sections, and an annular flange 240 extending outwardly from the main portion 224 and positioned on the pedestal 152. Additionally, the main portion 224 may include protrusions or grooves (not shown) that may correspond to grooves or protrusions formed on a bottom surface of the lower puck plate 232 for properly aligning the puck assembly 166 with the cooling plate 164. For example, a bottom surface of the chuck and a top surface of the cooling plate may include a mating feature to align the chuck with the cooling plate. In one embodiment, the cooling plate 164 may be fabricated by a composite ceramic, such as an aluminum-silicon alloy infiltrated SiC or Molybdenum to match a thermal expansion coefficient of the puck assembly 166.

Figure 3:
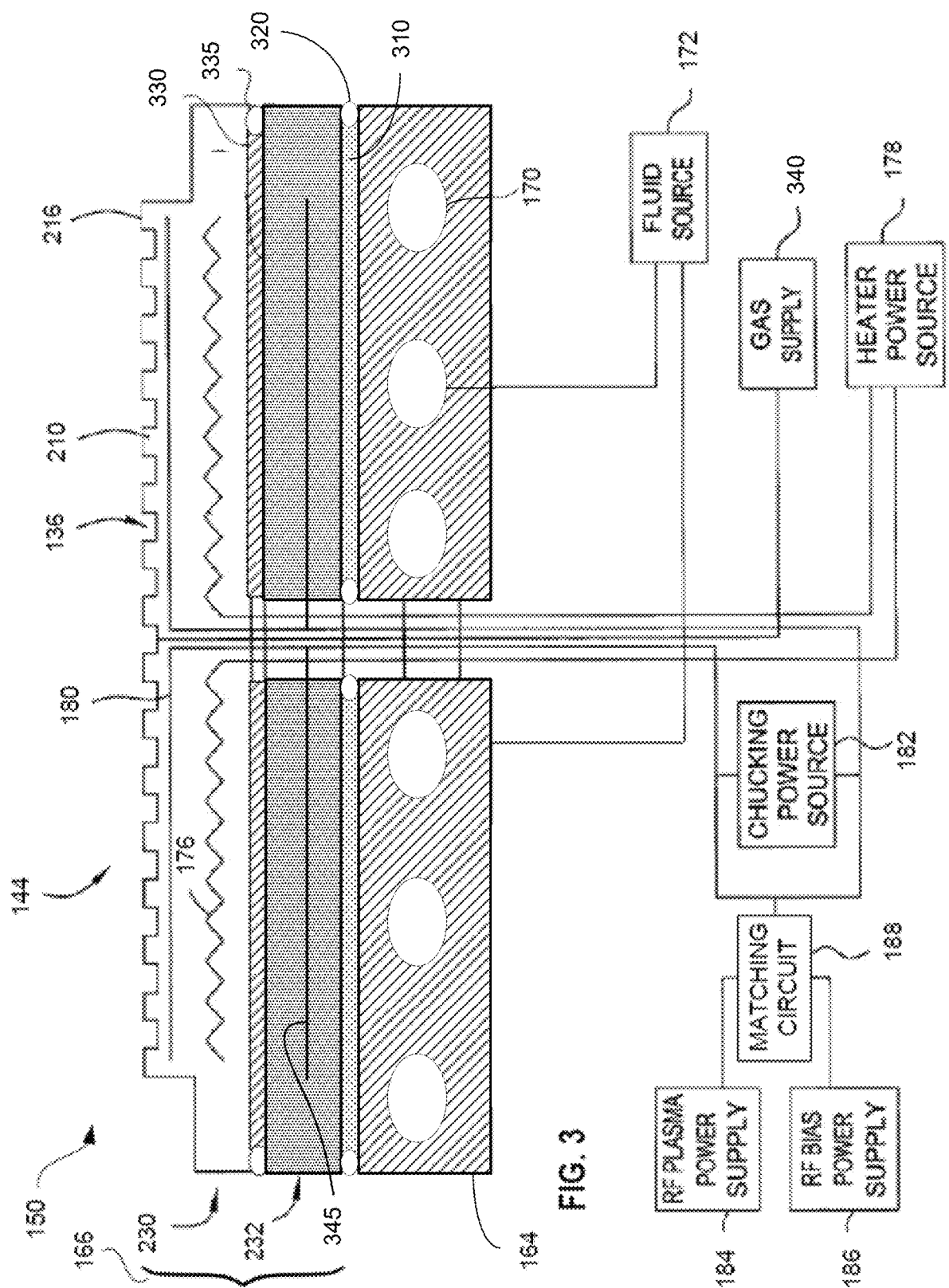
FIG. 3 depicts a sectional side view of one embodiment of a substrate support assembly.

FIG. 3 depicts a sectional side view of one embodiment of a substrate support assembly 150. The substrate support assembly 150 includes a puck assembly 166 including one or more puck plates, such as two plates, three plates, four plates, five plates, and so on. In some embodiments, the puck assembly 166 may include a top plate 230 and a bottom plate 232. Puck plate 232 may be permanently bonded to the cooling plate 164 using a bonding layer 310. Different techniques may be used to bond the puck plate 232 to the cooling plate 164. One technique that may be used for bonding is metal bonding. Polymer bonding, diffusion bonding, organic bonding, and so on may also be performed to bond plates together. In one embodiment, diffusion bonding is used as a method of metal bonding the bottom plate 232 to the cooling plate 164. One or more o-rings 320 may surround bonding layer 310 to protect the bonding layer 310 contained between the puck plate 232 and cooling plate 164.

The top plate 230 may include mesas 210, channels 212 and optionally an outer ring 216. In one embodiment, the puck plate 230 includes functional elements such as one or more clamping electrodes 180, one or more heating elements 176, and/or one or more RF electrodes (not shown). Alternatively, the clamping electrodes 180, heating elements 176, and RF electrodes may be disposed in different plates. The clamping electrodes 180 may be coupled to a chucking power source 182, and/or to an RF plasma power supply 184 and/or an RF bias power supply 186 via a matching circuit 188. Similarly, puck plate 232 may include one or more clamp electrodes 345, which may be used to clamp the bottom puck plate 232 to the top puck plate 230. In some embodiments, clamp electrodes 345 and 180 may be connected to the same power source. In some embodiments, clamp electrodes 345 and 180 may be connected to different power sources. The puck plates 230, 232 and/or other plates may additionally include gas delivery holes (not shown) through which a gas supply 340 pumps a backside gas such as He. Additionally, the puck plates 230, 232 and/or other plates may additionally include one or more cooling holes (not shown) for a cooling fluid to flow therethrough.

The puck plates 230, 232 and/or other plates may have a thickness of about 1-25 mm or more. The clamping electrodes 180 may be located about 0.25 mm from an upper surface of the puck plate 230, the heating elements 176 may be located about 1 mm under the clamping electrodes 180, and RF electrodes may be located about 0.5 mm under the heating elements 176 in one example. In some embodiments, the top plate 230 may have additional clamp electrodes, similar to clamp electrodes 180, that may be located closer to a bottom surface of top plate 230. The additional clamp electrodes may be used to secure the top plate 230 to the bottom plate 232, as described below. The heating elements 176 may be screen printed heating elements having a thickness of about 10-200 microns in some embodiments. Alternatively, the heating elements may be resistive coils that use about 1-3 mm of thickness of the puck plate 230 in some embodiments. In such an embodiment, the puck plate 230 may have a minimum thickness of about 5 mm. In some embodiments, the puck plates have thicknesses ranging from 1 mm to 10 mm, 2 mm to 8 mm, or other thicknesses. In embodiments, different puck plates may have the same or different thicknesses, which may range from 1-25 mm, for example.

The heating elements 176 are electrically connected to a heater power source 178 for heating the puck plate 230. The puck plate 230 may include electrically insulative materials such as AlN. In one embodiment, the puck plate 230 is composed of a metal matrix composite material. In one aspect, the metal matrix composite material includes aluminum and silicon. In one embodiment, the metal matrix composite is a SiC porous body infiltrated with an AlSi alloy.

In some embodiments, an interface layer 330 may be used to separate the top plate 230 from the bottom plate 232. The interface layer 330 may have a coefficient of thermal expansion and/or thermal conductivity that is close to that of the top plate 230 and/or bottom plate 232. In some embodiments, interface layer 330 may include an organic material, such as a polymer. One or more o-rings 335 may surround interface layer 330 to keep the interface layer 330 contained between the puck plate 232 and puck plate 230.

The puck plate 232 is coupled to and in thermal communication with a cooling plate 164 having one or more conduits 170 (also referred to herein as cooling channels) in fluid communication with fluid source 172. In one embodiment, the cooling plate 164 is coupled to the puck plate 232 using a dielectric material (e.g., a ceramic layer). Larger separation may decrease heat transfer, and cause the interface between the puck assembly 166 and the cooling plate 164 to act as a thermal choke. In one embodiment, a conductive gas may be flowed into the conduits 170 to improve heat transfer between the puck assembly 166 and the cooling plate 164. In some embodiments, an o-ring or gasket is not used between puck assembly 166 and cooling plate 164. In some embodiments, a separation between puck assembly 166 and cooling plate 164 minimizes the contact area between the puck assembly 166 and the cooling plate 164.

In some embodiments, the plate 232 and the cooling plate 164 are not bonded together. In such embodiments, fasteners may be used to couple the plate 232 and the cooling plate 164 together. For example, plate 232 and cooling plate 164 may each include features for accommodating a threaded insert and/or ahead of a threaded fastener. The threaded fastener may then extend between the plate 232 and the cooling plate 164 and be tightened against the threaded insert in the cooling plate.

In one embodiment (not shown), a grafoil layer or other flexible graphite layer is disposed between the puck assembly 166 and the cooling plate 164. The flexible graphite may have a thickness of about 10-40 mil. The flexible graphite may be thermally conductive, and may improve a heat transfer between the puck assembly 166 and the cooling plate 164.

In one embodiment, the cooling plate 164 includes a base portion (not shown). In one embodiment, the cooling plate 164 includes a spring loaded inner heat sink connected to the base portion by one or more springs. The springs apply a force to press the inner heat sink against the puck assembly 166. A surface of the heat sink may have a predetermined roughness and/or surface features (e.g., mesas) that control heat transfer properties between the puck assembly 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

FIG. 4A depicts a cross-sectional view of a substrate support assembly 400, according to one embodiment. The substrate support assembly 400 (e.g., an electrostatic chuck assembly) may include one or more puck plates 402 and a cooling plate 404. The puck plate 402 may include one or more functional elements. The functional elements may include a clamp electrode, a heating element, a zone heater, a pixelated heater, a radio frequency (RF) electrode, a RF filter, a gas channel, a cooling channel, or combinations thereof. In some embodiments, the puck plate 402 may include one or more clamp electrodes 406, 408 for creating an electrostatic force that holds the substrate or wafer in place during processing in the chamber (e.g., processing chamber 100). In some embodiments, the puck plate 402 may include RF electrodes (not shown) to ensure that interference and noise are minimized, reducing any potential impact on the substrate or wafer. In some embodiments, the puck plate 402 may include heating electrodes (not shown) that may cover a portion or an entire area of the puck plate 402. In some embodiments, the puck plate 402 may include zone heaters, which may each cover only a portion of the area of the puck plate 402. The puck plate 402 may include two, three, or four such zone heaters in the same place or in different planes. Similarly, the clamp electrodes 406, 408, RF electrodes, and heaters may be disposed in the same plane or different planes of the puck plate 402. Each of the functional elements may be connected to a different power source (not shown) via terminals that may be routed to the top and/or bottom of the substrate support assembly 400. For example, in FIG. 4A, clamp electrodes 406, 408 may be connected to a common power source via terminals 420. However, clamp electrodes 416, 418 may be connected to a different power source via terminals 422, 424, respectively.

In some embodiments, the substrate support assembly 400 may include additional clamp electrodes 416, 418 for clamping the puck plate 402 to the cooling plate 404. Alternatively, the clamp electrodes 406, 408 may be energized with a greater potential so as to clamp a wafer or substrate on top of the puck plate 402 and the puck plate 402 to the cooling plate 404. In some embodiments, the clamp electrodes 406, 408, 416, 418 may be of the same dimension or made of the same material. In some embodiments, the clamp electrodes 406, 408, 416, 418 may have different dimensions or can be made of the different materials.

The substrate support assembly 400 may further include a cooling plate 404, which may be a metal cooling plate or a dielectric or ceramic cooling plate. Cooling plate 404 may include one or more cooling loops or channels (not shown) to circulate a cooling fluid (e.g., a coolant or a refrigerant or gas) and absorb the heat from the puck plate 402. The cooling plate 404 may also include one or more gas channels 414 for a gas (e.g., inert gas) to flow therethrough. The gas channels 414 may be fluidly coupled to a source of a heat transfer (or backside) gas, such as He via holes drilled in the puck plate 402. In operation, the backside gas may be provided at controlled pressure into the gas channels 414 to enhance the heat transfer between the puck plate 402 and the substrate. The cooling channels and gas channels 414 may have any shape such as a square, a rectangle, a circle, an oval, a fin shape, or combinations thereof. In some embodiments, a dimension of the cooling channels and/or the gas channels 414 may be determined based on a thermal conductivity of the dielectric material forming the cooling plate 404. For example, if the thermal conductivity is low, the cooling plate may have larger cooling channels and/or the gas channels 414. In another example, if the thermal conductivity is high, then the cooling plate may have smaller cooling channels and/or smaller gas channels 414. In some embodiments, the cooling plate 404 may further include one or more terminals 420, 422, 424, which may be used to connect one or more functional elements in puck plate 402 to one or more power sources. In some embodiments, the cooling plate 404 further includes one or more vias 428 for the terminals 420, 422, 424 to pass therethrough.

In some embodiments, the cooling plate 404 may include one or more through holes 426 for disposing actuators, for example, lift pins 432. The lift pins 432 may be used to separate or lift the puck plate 402 away from the cooling plate 404. In some embodiments, the lift pins 432 may rise when engaged and lift the puck plate 402 above the cooling plate 404. Similarly, the lift pins 432 may be positioned in the through holes 426 when disengaged, and the puck plate 402 would be in contact with the cooling plate 404. The lift pins 432 may be actuated using a DC motor such as a linear servo motor, for example.

In some embodiments, the puck plate 402 and cooling plate 404 may be separated by an interface layer 410. The interface layer 410 may include Ni, Ti, C, Si, a flexible graphite layer, an organic elastomer, Al, In, Ni, Ti, and/or an alloy including Ni—Ti or Mo—Mg, or Cu—Ag or Al alloy. In some embodiments, the interface layer 410 may have a texture on at least one of a top surface or a bottom surface to increase electrostatic coupling of the puck plate 402 to the cooling plate 404. For example, the interface layer 410 may have grooves or a pattern formed on the top surface and/or bottom surface to increase electrostatic coupling of the puck plate 402 to the cooling plate 404. The interface layer 432 may include one or more vias, through holes, and gas channels corresponding to the vias, through holes, and gas channels in the cooling plate so that when a gas (e.g., He) is pumped under the puck plate 402, the gas channels in the interface layer may facilitate separation of the puck plate 402 from the cooling plate 404. In some embodiments, the interface layer 432 may be surrounded by one or more o-rings or gaskets 412, which may retain the interface layer 432 in position when a puck plate 402 is removed from the substrate support assembly 400. Examples of materials that may be used in forming the puck plate 402, and the cooling plate 404 include niobium, aluminum oxide, aluminum nitride, single crystal alumina, or sapphire. In some embodiments, the puck plate 402 and the cooling plate 404 may be formed using a hot press, a hot isostatic press, a green sheet, a gel cast, or a sol gel process, for example.

FIG. 4B depicts a cross-sectional view of a substrate support assembly 450, according to one embodiment. In this embodiment, clamp electrodes 406, 408 and clamp electrodes 416, 418 may be connected to a common power source via terminals 430. In some embodiments, clamp electrodes 406, 416 and clamp electrodes 408, 418 may be connected to different power sources.

Figures 5A, 5B:
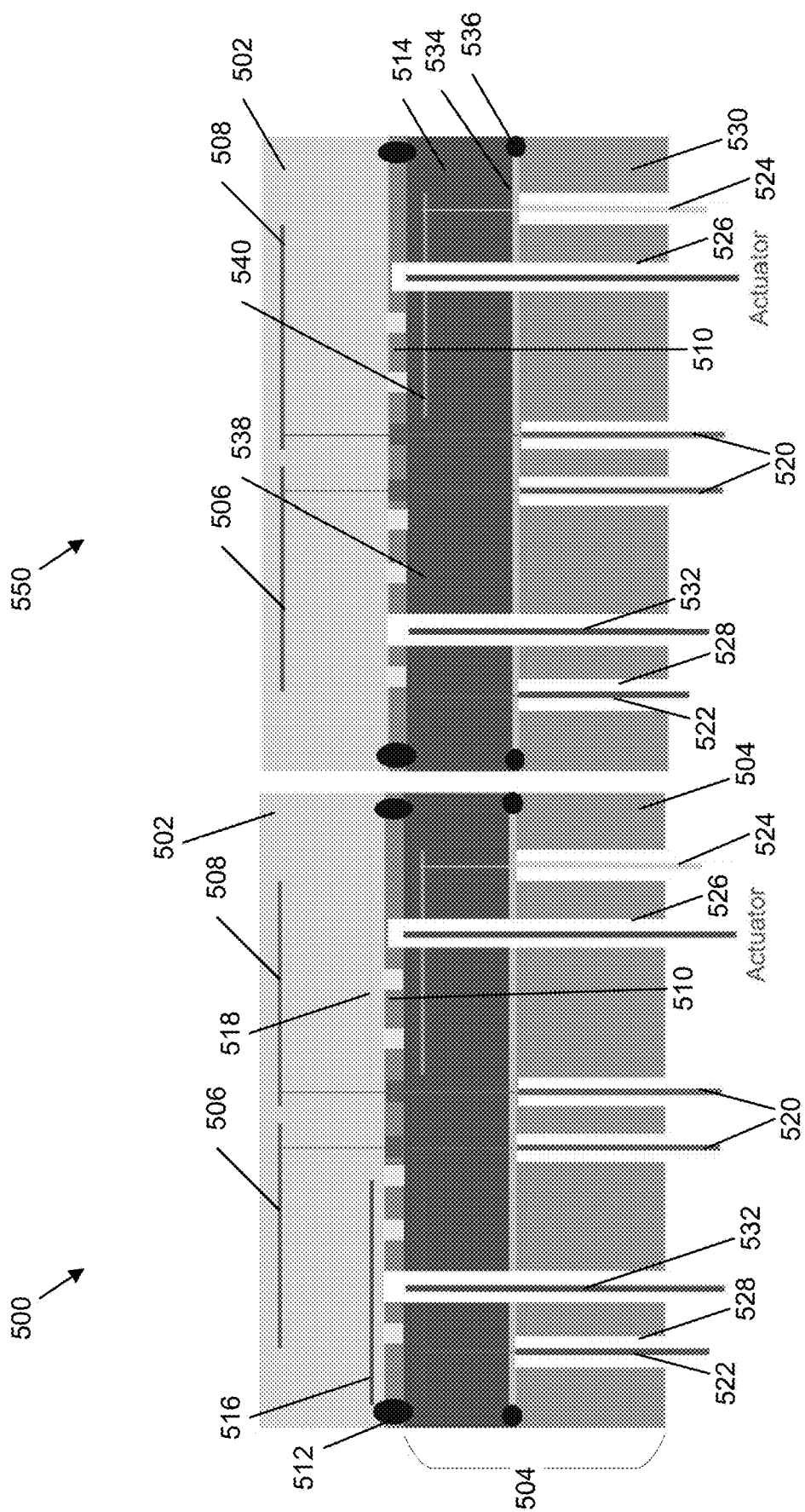
FIGS. 5A & 5B depict sectional side views of embodiments of a substrate support assembly.

FIG. 5A depicts a cross-sectional view of a substrate support assembly 500, according to one embodiment. The substrate support assembly 500 (e.g., an electrostatic chuck assembly) may include one or more puck plates 502 and a cooling plate 504. In some embodiments, the cooling plate 504 may be formed of a dielectric material. In some embodiments, the cooling plate 504 may include two dielectric plates. The two dielectric plates may include a first dielectric plate 514 that may be permanently bonded to a second dielectric plate 530 using a bonding layer 534. The bonding layer 534 may include Ni, Ti, C, Si, a flexible graphite layer, an organic elastomer, Al, In, Ni, Ti, and/or an alloy including Ni—Ti or Mo—Mg, or Cu—Ag or Al alloy. The bonding layer 534 may include one or more vias, through holes, and gas channels corresponding to the vias, through holes, and gas channels in the cooling plate so that when a gas (e.g., He) is pumped under the puck plate 502, the gas channels in the interface layer may facilitate separation of the puck plate 502 from the cooling plate 504. In some embodiments, the bonding layer 534 may be surrounded by one or more o-rings or gaskets 536, which may retain the bonding layer 534 in position in high temperature environments. The first dielectric plate 514 and the second dielectric plate 530 may include the same dielectric material. In some embodiments, the first dielectric plate 514 and the second dielectric plate 530 may include different dielectric materials.

In some embodiments, the first dielectric plate 514 and the second dielectric plate 530 may include one or more cooling loops or channels (not shown) to circulate a cooling fluid (e.g., a coolant or a refrigerant or gas) and absorb the heat from the puck plate 502. The first dielectric plate 514 and the second dielectric plate 530 may also include one or more gas channels (similar to gas channels 414) for a gas (e.g., inert gas) to flow therethrough. The gas channels may be fluidly coupled to a source of a heat transfer (or backside) gas, such as He via holes drilled in the puck plate 502. In operation, the backside gas may be provided at controlled pressure into the gas channels to enhance the heat transfer between the puck plate 502 and the substrate. The cooling channels and gas channels may have any shape such as a square, a rectangle, a circle, an oval, a fin shape, or combinations thereof.

In some embodiments, a dimension of the cooling channels and/or the gas channels may be determined based on a thermal conductivity of the dielectric material forming the cooling plate 504. For example, if the thermal conductivity is low, the cooling plate may have larger cooling channels and/or the gas channels. In another example, if the thermal conductivity is high, then the cooling plate may have smaller cooling channels and/or smaller gas channels. In some embodiments, the first dielectric plate 514 and the second dielectric plate 530 may further include one or more terminals 520, 522, 524, which may be used to connect one or more functional elements in puck plate 502 to one or more power sources. In some embodiments, the first dielectric plate 514 and the second dielectric plate 530 further includes one or more vias 528 for the terminals 520, 522, 524 to pass therethrough.

In some embodiments, the cooling plate 504 may include one or more through holes 526 for disposing actuators, for example, lift pins 532. The lift pins 532 may be used to separate or lift the puck plate 502 away from the cooling plate 504. In some embodiments, the lift pins 532 may rise when engaged and lift the puck plate 502 above the cooling plate 504. Similarly, the lift pins 532 may be positioned in the through holes 526 when disengaged, and the puck plate 502 would be in contact with the cooling plate 504. The lift pins 532 may be actuated using a DC motor such as a linear servo motor, for example. In some embodiments, the puck plate 502 and cooling plate 504 may be separated by an interface layer 510. The interface layer 510 may include Ni, Ti, C, Si, a flexible graphite layer, an organic elastomer, Al, In, Ni, Ti, and/or an alloy including Ni—Ti or Mo—Mg, or Cu—Ag or Al alloy. The interface layer 532 may include one or more vias, through holes, and gas channels corresponding to the vias, through holes, and gas channels in the cooling plate so that when a gas (e.g., He) is pumped under the puck plate 502, the gas channels in the interface layer may facilitate separation of the puck plate 502 from the cooling plate 504. In some embodiments, the interface layer 532 may be surrounded by one or more o-rings or gaskets 512, which may retain the interface layer 532 in position when a puck plate 502 is removed from the substrate support assembly 500. Examples of materials that may be used in forming the puck plate 502, and the cooling plate 504 include niobium, aluminum oxide, aluminum nitride, single crystal alumina, or sapphire. In some embodiments, the puck plate 502 and the cooling plate 504 may be formed using a hot press, a hot isostatic press, a green sheet, a gel cast, or a sol gel process, for example.

The puck plate 502 may include one or more functional elements. The functional elements may include a clamp electrode, a heating element, a zone heater, a pixelated heater, a radio frequency (RF) electrode, a RF filter, a gas channel, a cooling channel, or combinations thereof. In some embodiments, the puck plate 502 may include one or more clamp electrodes 506, 508 for creating an electrostatic force that holds the substrate or wafer in place during processing in the chamber (e.g., processing chamber 100). In some embodiments, the puck plate 502 may include RF electrodes (not shown) to ensure that interference and noise are minimized, reducing any potential impact on the substrate or wafer. In some embodiments, the puck plate 502 may include heating electrodes (not shown) that may cover a portion or an entire area of the puck plate 502. In some embodiments, the puck plate 502 may include zone heaters, which may each cover only a portion of the area of the puck plate 502. The puck plate 502 may include two, three, or four such zone heaters in the same place or in different planes. Similarly, the clamp electrodes 506, 508 RF electrodes, and heaters may be disposed in the same plane or different planes of the puck plate 502. In some embodiments, the substrate support assembly 500 may include additional clamp electrodes 516, 518 for clamping the puck plate 502 to the cooling plate 504. In some embodiments, the clamp electrodes 506, 508, 516, 518 may be of the same dimension or made of the same material. In some embodiments, the clamp electrodes 506, 508, 516, 518 may have different dimensions or can be made of the different materials. Each of the functional elements may be connected to a different power source (not shown) via terminals that may be routed to the top and/or bottom of the substrate support assembly 500. For example, in FIG. 5A, clamp electrodes 506, 508 may be connected to a common power source via terminals 520. However, clamp electrodes 516, 518 may be connected to a different power source via terminals 522, 524, respectively.

FIG. 5B depicts a cross-sectional view of a substrate support assembly 450, according to one embodiment. In this embodiment, the additional clamp electrodes 516, 518 are absent from puck plate 502. However, a greater potential (e.g., voltage) may be applied to clamp electrodes 506, 508 via terminals 520 such that the clamp electrodes 506, 508 generate sufficient electrostatic chucking force to clamp the puck plate 502 to the top plate 514 of the cooling plate 504.

In embodiments, one or more plates of a puck plate assembly (e.g., an entire chuck or one or more plates of a chuck) are automatically replaceable without manual intervention. For example, a chuck may be installed in a process chamber, and when that chuck wears out or malfunctions, the chuck may be removed from the process chamber by a robot arm and then moved to a side storage pod (SSP) or carrier (e.g., front opening unified pod (FOUP)) for disposal or refurbishment. A new chuck or one or more plates of a chuck may be placed into the process chamber and electrostatically secured to a cooling plate or one or more other plates of the chuck in the process chamber. This entire process may be fully automated in embodiments.

Figure 6:
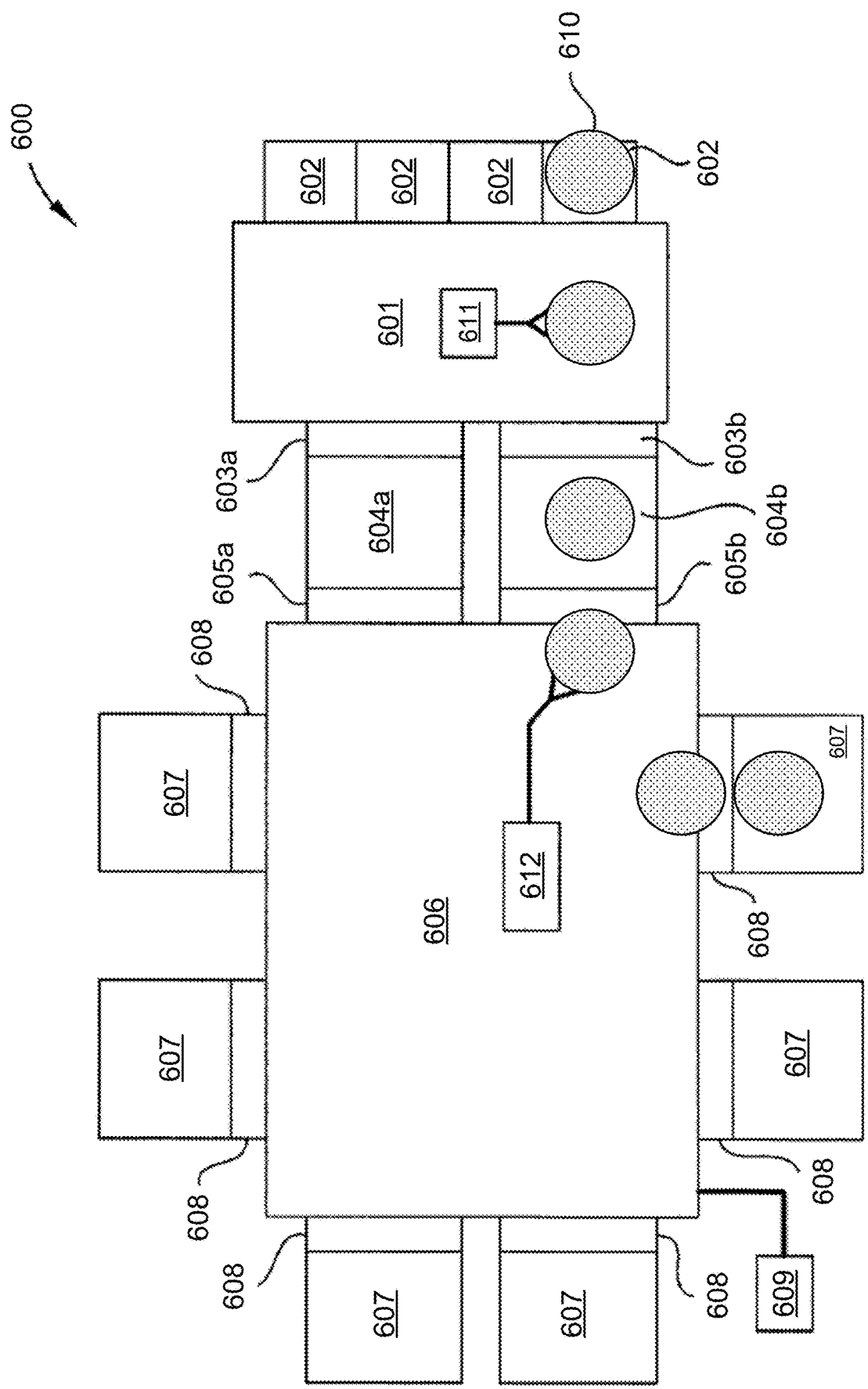
FIG. 6 illustrates a simplified top view of an example processing system, according to one aspect of the disclosure.

FIG. 6 illustrates an example processing system 600, according to one aspect of the disclosure. The processing system 600 includes a factory interface 601 to which a plurality of substrate cassettes 602 (e.g., front-opening unified pods (FOUPs)) may be coupled for transferring substrates (e.g., wafers such as silicon wafers) into the processing system 600. The processing system 600 may also include first vacuum ports 603a, 603b that may couple the factory interface 601 to respective stations 604a, 604b, which may be, for example, degassing chambers and/or load locks. Second vacuum ports 605a, 605b may be coupled to respective stations 604a, 604b and disposed between the stations 604a, 604b and a transfer chamber 606 to facilitate transfer of substrates into the transfer chamber 606. The transfer chamber 606 includes a plurality of processing chambers (also referred to as process chambers) 607 (e.g., processing chamber 100) disposed therearound and coupled thereto. The processing chambers 607 are coupled to the transfer chamber 606 through respective ports 608, such as slit valves or the like.

The processing chambers 607 may include or more of etch chambers, deposition chambers (including atomic layer deposition, chemical vapor deposition, physical vapor deposition, or plasma enhanced versions thereof), anneal chambers, and the like. Some of the processing chambers 607, such as deposition chambers, may include electrostatic chucks therein, which occasionally undergo replacement. While replacement of electrostatic chucks in conventional systems includes intervention by an operator to replace the electrostatic chuck, the processing system 600 is configured to facilitate replacement of electrostatic chucks without intervention by an operator.

Factory interface 601 includes a factory interface robot 611. Factory interface robot 611 may include a robot arm, and may be or include a selective compliance assembly robot arm (SCARA) robot, such as a 2 link SCARA robot, a 3 link SCARA robot, a 4 link SCARA robot, and so on. The factory interface robot 611 may include an end effector on an end of the robot arm. The end effector may be configured to pick up and handle specific objects, such as substrates and/or electrostatic chucks. Alternatively, the end effector may be configured to handle objects such as components of electrostatic chucks. The factory interface robot 611 may be configured to transfer objects such a substrates, chucks, plates of chucks, etc. between cassettes 602 (e.g., FOUPs) and stations 604a, 604b.

Transfer chamber 606 includes a transfer chamber robot 612. Transfer chamber robot 612 may include a robot arm with an end effector at an end of the robot arm. The end effector may be configured to handle particular objects, such as substrates and/or electrostatic chucks. The transfer chamber robot 612 may be a SCARA robot, but may have fewer links and/or fewer degrees of freedom than the factory interface robot 611 in some embodiments.

A controller 609 controls various aspects of the processing system 600. The controller 609 may be and/or include a computing device such as a personal computer, a server computer, a programmable logic controller (PLC), a microcontroller, and so on. The controller 609 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 609 may include a data storage device (e.g., one or more disk drives and/or solid state drives), a main memory, a static memory, a network interface, and/or other components. The controller 609 may execute instructions to perform any one or more of the methodologies and/or embodiments described herein. In embodiments, the controller is configured to cause one or more robots to replace a used chuck (or plate of a chuck) with a new chuck (or new plate of a chuck). The instructions may be stored on a computer readable storage medium, which may include the main memory, static memory, secondary storage and/or processing device (during execution of the instructions). The controller 609 may receive signals from and send controls to factory interface robot 611, wafer transfer chamber robot 612, non-contact sensors in embodiments.

In embodiments, once a determination is made that a chuck is to be replaced, controller 609 may de-energize one or more clamping electrodes used to clamp a chuck to a cooling plate (or a plate of a chuck to another plate of the chuck). Controller 609 may additionally cause a set of lift pins to lift the chuck (or plate(s) of the chuck), and cause robot 612 to retrieve the chuck and move chuck into load lock 604a, 604b. Controller 609 may cause robot 611 to retrieve the chuck from the load lock 604a, 604b, and to place the chuck into a cassette 602 or SSP. Controller 609 may further cause robot 611 to retrieve a new chuck and place the new chuck in a load lock 604a, 604b. Controller 609 may further cause robot 612 to retrieve the chuck from load lock 604a, 604b and place the new chuck in process chamber 607. Controller 609 may then cause one or more clamping electrodes to energize to electrostatically secure chuck 610 to a cooling plate in process chamber 607.

FIG. 6 schematically illustrates transfer of a puck plate 610 of an electrostatic chuck or other chuck (or entire chuck) into a processing chamber 607. According to one aspect of the disclosure, a puck plate 610 is removed from processing chamber 607 via factory interface robot 611 located in the factory interface 601, or alternatively, is loaded directly into the factory interface 601. Puck plates are discussed herein, but it should be understood that embodiments described with reference to puck plates also apply to other electrostatic chucks and to other objects other than chucks.

The factory interface robot 611 may place the puck plate 610 into station 604a or 604b through a vacuum port 603a, 603b. A transfer chamber robot 612 located in the transfer chamber 606 removes the puck plate 610 from one of the stations 604a, 604b through a second vacuum port 605a or 605b. The transfer chamber robot 612 moves the puck plate 610 (which at this point has the correct state) into the transfer chamber 606, where the puck plate 610 may be transferred to a destination processing chamber 607 though a respective port 608.

While not shown for clarity in FIG. 6, transfer of the puck plate 610 may occur while the puck plate 610 is positioned on a carrier or adapter, and the end effectors may pick up and place the carrier or adapter that holds the puck plate 610. This may enable an end effector that is configured for handling of substrates to be used to also handle the puck plate 610.

Figure 7:
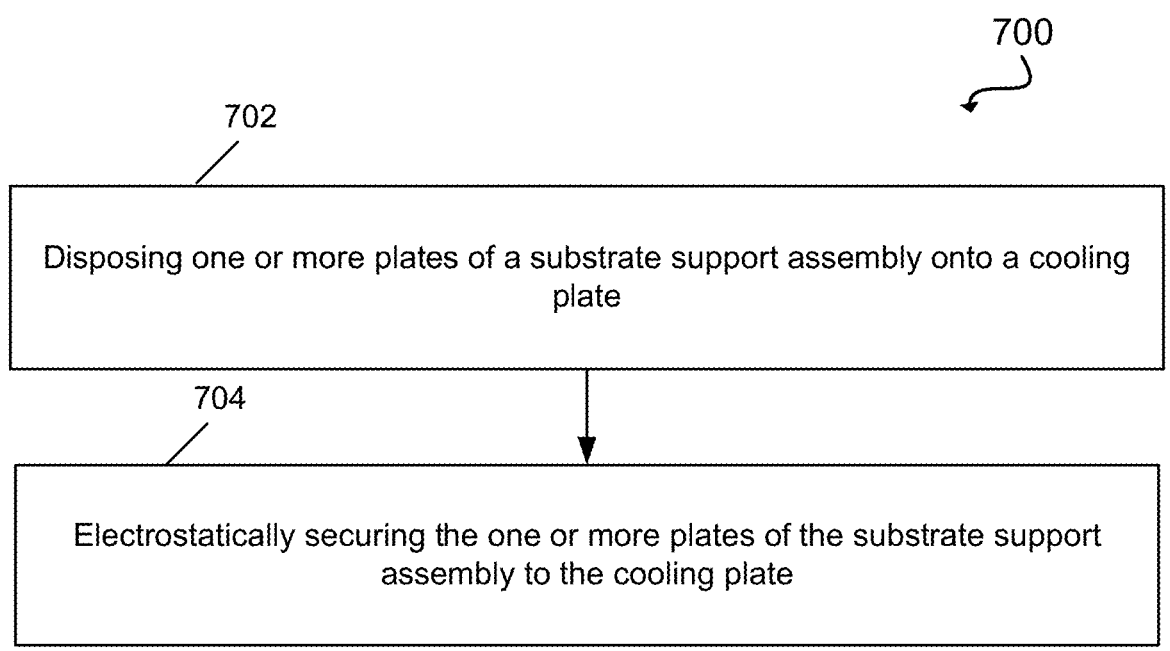
FIG. 7 illustrates one embodiment of a method of forming a substrate support assembly.

FIG. 7 illustrates example operations in a method 700 of forming a substrate support assembly, according to some embodiments, which does not include bonding a puck assembly to a cooling plate.

At block 702, method 700 involves disposing one or more plates (e.g., puck plate 232, 402, 502) of a substrate support assembly onto a cooling plate (e.g., cooling plate 164, 404, 504). The one or more plates may be disposed on the cooling plate manually by a person or automatically using a robot and/or lift pins. The puck plates and/or the cooling plate may include a dielectric material. In some embodiments, the puck plate may include one or more clamp electrodes. The clamp electrodes may be disposed closer to a bottom surface of the puck plate. In some embodiments, the cooling plate may include one or more clamp electrodes. The clamp electrodes may be disposed closer to a top surface of the cooling plate. At block 704, method 700 includes electrostatically securing the one or more plates of the substrate support assembly to the cooling plate, forming an electrostatic chuck. The one or more plates of the substrate support assembly may be electrostatically secured to the cooling plate by energizing one or more clamping electrodes in a plate of the one or more plates and/or in the cooling plate.

Figure 8:
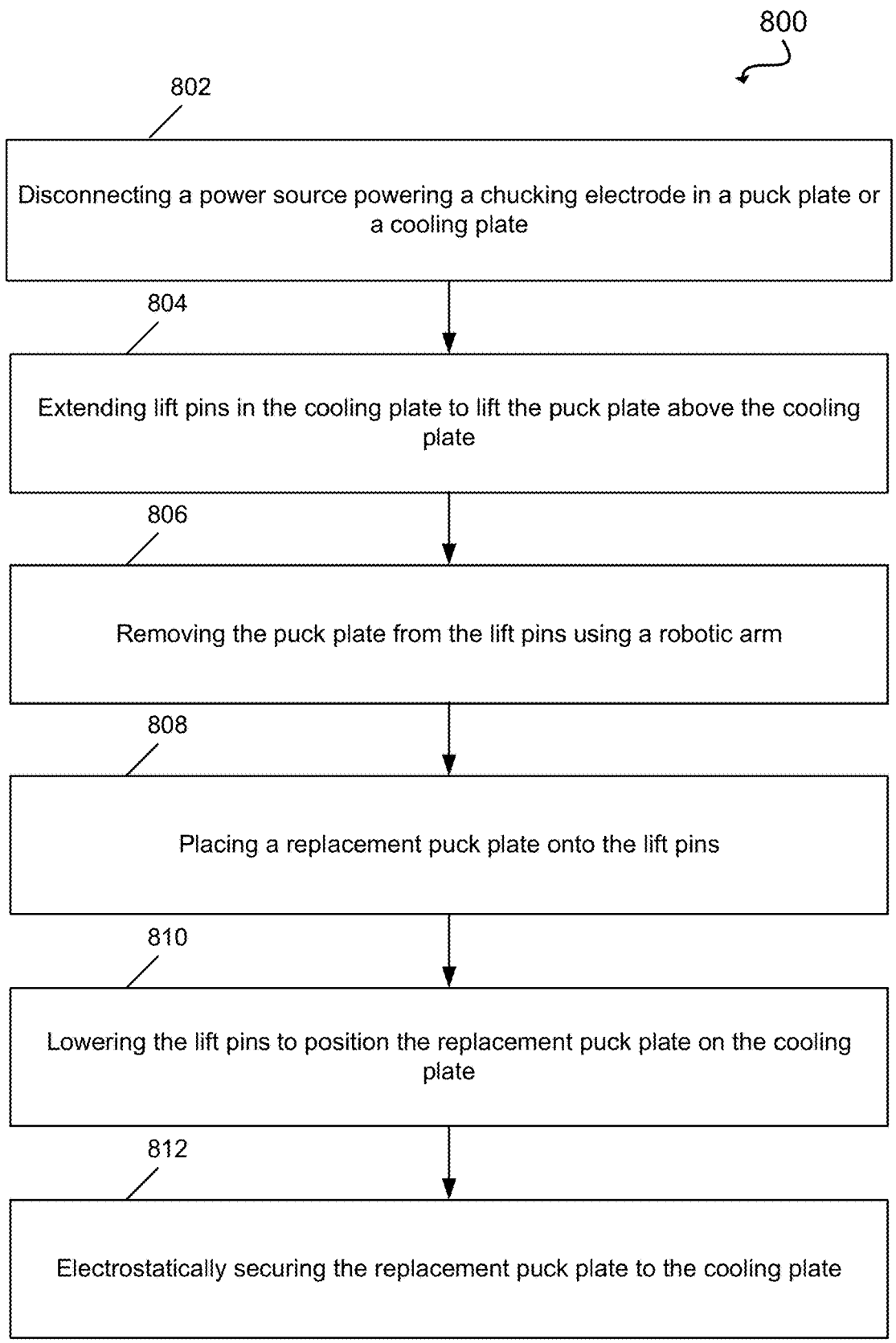
FIG. 8 illustrates one embodiment of a method for replacing a plate in a substrate support assembly.

FIG. 8 illustrates example operations in a method 800 for replacing one or more plates in a substrate support assembly, according to some embodiments. When one or more plates of the substrate support assembly are ready to be replaced, either because a plate is damaged, worn, broken, etc., the method 800 may include disconnecting (or powering off) a power source powering a clamp electrode in the puck plate and/or a cooling plate of the substrate support assembly, at block 802. The method 800 may further include pumping a gas (e.g., He) at high pressure into one or more channels of an interface layer between a bottom plate of the puck assembly and the cooling plate to facilitate separation of the one or more plates from the cooling plate. At block 804, the method 800 may further include extending one or more lift pins in the cooling plate to lift the puck plate above the cooling plate. At block 806, the method 800 may further include removing the puck plate from the lift pins using a robotic arm of a robot (e.g., robot 611, 612).

The removed plates may be repaired and reused or replaced in embodiments. At block 808, the method 800 may further include placing a replacement puck plate onto the lift pins. The method may include lowering the lift pins to position the replacement puck plate on the cooling plate, at block 810. The lower surface of the puck plate and/or top surface of the cooling plate may include mating features that may facilitate correct positioning or alignment of the puck plate with the cooling plate. These mating features may include grooves, projections, protrusions, notches, etc.

At block 812, the method 800 may further include electrostatically securing the replacement puck plate to the cooling plate by energizing the clamp electrodes in the replacement puck plate and/or cooling plate. In some embodiments, if the puck plate does not have an additional pair of clamp electrodes to clamp the puck plate to the cooling plate, then a greater potential (e.g., voltage) may be applied to the existing clamp electrodes in order to clamp the puck plate to the cooling plate and reforming the substrate support assembly.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly, comprising:
   a cooling plate, wherein the cooling plate comprises one or more first clamping electrodes to electrostatically secure a chuck to the cooling plate; and
   the chuck disposed on the cooling plate, the chuck comprising:
   one or more heating electrodes; and one or more second clamping electrodes to electrostatically secure the chuck to the cooling plate.

2. The substrate support assembly of claim 1, wherein the cooling plate is a metal cooling plate, and the substrate support assembly further comprising:
a dielectric layer on the cooling plate.

3. The substrate support assembly of claim 1, wherein the cooling plate comprises a dielectric material.

4. The substrate support assembly of claim 1, wherein the chuck is an electrostatic chuck comprising one or more third clamping electrodes to electrostatically chuck a substrate.

5. The substrate support assembly of claim 4, wherein the one or more clamping electrodes and the one or more third clamping electrodes are connected to a same power source.

6. The substrate support assembly of claim 1, wherein the cooling plate further comprises:
one or more holes formed in a body of the cooling plate; and
one or more lift pins configured to pass through the one or more holes, wherein the one or more lift pins are to at least partially lift the chuck away from the cooling plate when actuated.

7. The substrate support assembly of claim 1, further comprising:
an o-ring at least partially surrounding an interface layer between the cooling plate and the chuck.

8. The substrate support assembly of claim 1, further comprising:
an interface layer between the chuck and the cooling plate.

9. The substrate support assembly of claim 8, wherein the interface layer comprises one or more gas channels that align with one or more channels in the cooling plate, and wherein a controller is to pump gas into the interface layer to facilitate separation of the chuck from the cooling plate during a chuck replacement operation.

10. The substrate support assembly of claim 8, wherein the interface layer has a texture on at least one of a top surface or a bottom surface to increase electrostatic coupling of the chuck to the cooling plate.

11. The substrate support assembly of claim 8, wherein the interface layer comprises at least one of a polymer, flexible graphite, an organic elastomer, Al, In, Ni, Ti, or an alloy comprising Ni—Ti or Mo—Mg.

12. The substrate support assembly of claim 1, wherein the cooling plate further comprises:
a first dielectric plate comprising one or more third clamping electrodes to electrostatically clamp the chuck on the cooling plate; and
a second dielectric plate at least partially bonded to the first dielectric plate, wherein the second dielectric plate comprises one or more through vias for connecting the one or more second clamping electrodes or the one or more third clamp electrodes to a power source.

13. The substrate support assembly of claim 12, further comprising:
a bonding layer at least partially bonding the first dielectric plate to the second dielectric plate; and
an o-ring at least partially surrounding the bonding layer.

14. The substrate support assembly of claim 12, wherein the first dielectric plate and the second dielectric plate comprise at least one of a ceramic or an Al—SiC composite.

15. The substrate support assembly of claim 1, wherein a bottom surface of the chuck and a top surface of the cooling plate comprise a mating feature to align the chuck with the cooling plate.

16. A substrate support assembly comprising:
a cooling plate, wherein the cooling plate comprises one or more first clamping electrodes to electrostatically secure a chuck to the cooling plate;
a first puck plate bonded to the cooling plate; and
a second puck plate disposed on the first puck plate, the second puck plate comprising one or more second clamping electrodes to electrostatically secure the second puck plate to the first puck plate.

17. The substrate support assembly of claim 16, wherein the cooling plate is a ceramic cooling plate, and wherein the ceramic cooling plate is separated from the first puck plate by an interface layer.

18. A method comprising:
disposing one or more plates of a substrate support assembly onto a cooling plate;
electrostatically securing the one or more plates of the substrate support assembly to the cooling plate; and
pumping a gas into one or more channels at an interface between a bottom plate of the one or more plates and the cooling plate to facilitate separation of the one or more plates from the cooling plate.

19. The method of claim 18, further comprising:
extending lift pins in the cooling plate to lift the one or more plates above the cooling plate;
removing the one or more plates from the lift pins using a robotic arm;
placing one or more replacement plates onto the cooling plate; and
electrostatically securing the one or more replacement plates to the cooling plate.

20. A method comprising:
disconnecting a power source powering a clamp electrode in a puck plate or a cooling plate;
pumping a gas into one or more channels of an interface between the puck plate and the cooling plate to facilitate separation of the puck plate from the cooling plate;
extending lift pins in the cooling plate to lift the puck plate above the cooling plate;
removing the puck plate from the lift pins using a robotic arm;
placing a replacement puck plate onto the lift pins;
lowering the lift pins to position the replacement puck plate on the cooling plate; and
electrostatically securing the replacement puck plate to the cooling plate.

* * * * *